United States Patent [19]
Gentile et al.

[11] 4,365,212
[45] Dec. 21, 1982

[54] GATED OSCILLATOR INCLUDING INITIALIZATION APPARATUS FOR ENHANCING PERIODICITY

[75] Inventors: Carmine Gentile, Hightstown; Nicholas Kucharewski, Lebanon, both of N.J.

[73] Assignee: RCA Corporation, New York, N.Y.

[21] Appl. No.: 192,364

[22] Filed: Sep. 30, 1980

[51] Int. Cl.³ .............................................. H03K 3/03
[52] U.S. Cl. ..................................... 331/111; 331/172
[58] Field of Search ......................... 331/111, 172, 173

[56] References Cited

U.S. PATENT DOCUMENTS

| | | | |
|---|---|---|---|
| 3,337,816 | 8/1967 | Vercellotti | 331/173 |
| 3,587,001 | 6/1971 | Parchim | 331/172 |
| 3,914,711 | 10/1975 | Carlson et al. | 331/111 X |
| 4,286,233 | 8/1981 | Kucharewski et al. | 331/111 |

OTHER PUBLICATIONS

Refioglu; "Achieving Stability in IC Oscillators;" 9-1-1-80; Electronics; pp. 124-130.

*Primary Examiner*—Siegfried H. Grimm
*Assistant Examiner*—Edward P. Westin
*Attorney, Agent, or Firm*—E. M. Whitacre; P. J. Rasmussen; P. M. Emanuel

[57] ABSTRACT

A gated oscillator is disclosed wherein the first period of oscillation is substantially equal to the steady state period of oscillation. The gated oscillator is of the type wherein oscillations are produced by charging and discharging a capacitor between respective first and second voltage levels. When the oscillator is stopped, the capacitor potential is maintained at the first voltage level, so that when the oscillator is started, the capacitor begins its charging cycle at the first voltage level.

4 Claims, 2 Drawing Figures

GATED OSCILLATOR INCLUDING INITIALIZATION APPARATUS FOR ENHANCING PERIODICITY

FIELD OF THE INVENTION

This invention relates to gated oscillators.

BACKGROUND OF THE INVENTION

A gated oscillator is responsive to an enabling signal to selectively condition the oscillator to start or stop oscillating.

In a known type of gated oscillator, periodic pulses are produced by charging and discharging a capacitor between first and second voltage levels. The capacitor is periodically charged from a first voltage level to a second voltage level, and then discharged from the second voltage level to the first voltage level. The potential on the capacitor therefore oscillates between the first and second voltage levels.

The oscillator is stopped by preventing the periodic charging and discharging of the capacitor. When the oscillator is stopped, the capacitor continues to discharge past the first voltage level towards the lower power supply potential. When the oscillator is started again, the capacitor begins charging from a lower potential than the first voltage level so that the first period of oscillation is longer than the steady state period of oscillation.

Therefore, a gated oscillator of the type described above, exhibits an error in the width of the first pulse. In certain applications, such first pulse error is undesirable. Specifically, in an automotive application, a gated oscillator is used as part of a system for converting analog quantities to digital form. Physical engine parameters (e.g. temperature, pressure, etc.) are sensed by the impedance change of respective sensors. The impedance change is converted in a charging circuit into a pulse width modulated signal.

The pulse width modulated signal operates the gated oscillator by starting the oscillator at the leading edge of the pulse and stopping the oscillator at the trailing edge thereof. The resulting output pulses from the gated oscillator are accumulated in a digital counter. The contents of the digital counter represent a digital measurement of pulse width, which is therefore proportionally related to the digital value of the sensed analog parameter. The first pulse error of the gated oscillator described above therefore causes an error in the digital measurement of the physical parameter.

The present invention is directed to a gated oscillator wherein the first pulse error is substantially eliminated.

SUMMARY OF THE INVENTION

In a gated oscillator arrangement, means are provided for maintaining the voltage on the capacitor at one of the first and second voltage levels when the oscillator has been stopped. Therefore, when the gated oscillator is started, the capacitor potential begins at one of the first and second voltage levels and charges toward the other voltage level, so that the duration of the first pulse produced is substantially equal to the duration of successive pulses.

DETAILED DESCRIPTION

Figure 1:
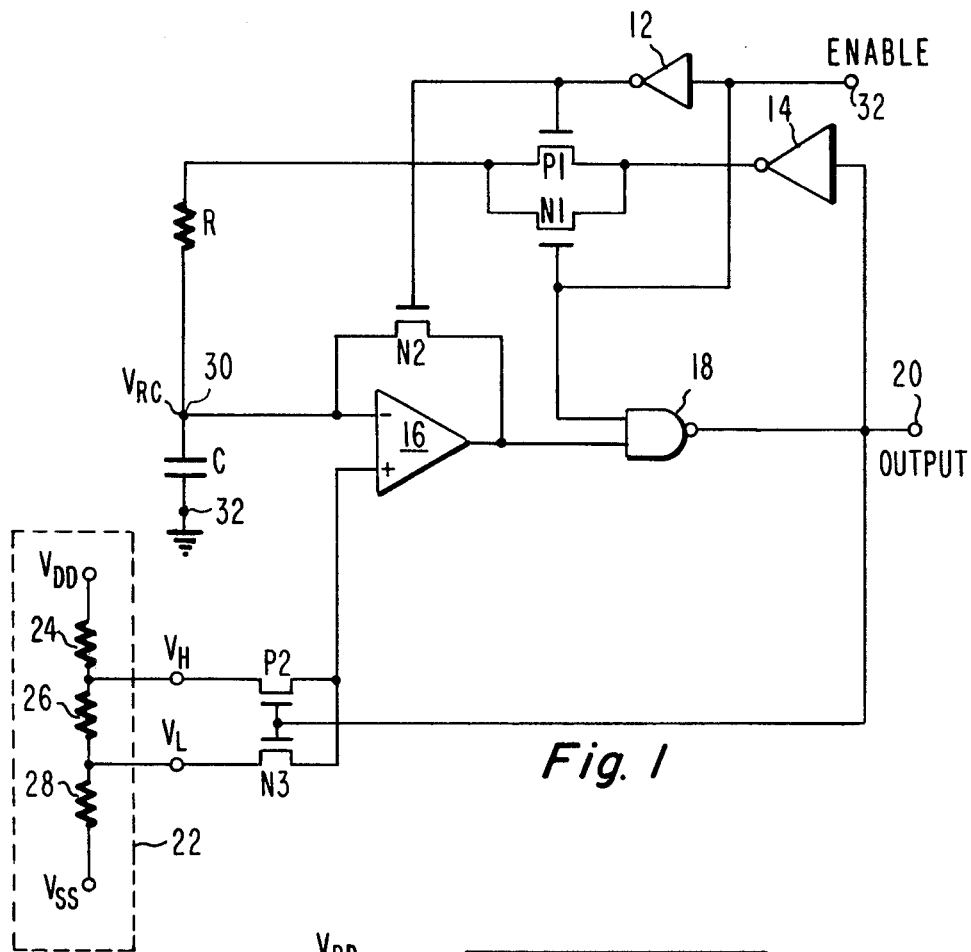
FIG. 1 is a schematic diagram of a gated oscillator embodying the present invention.

The gated oscillator of FIG. 1 comprises a resistor R, a capacitor C, a differential amplifier 16, a NAND gate 18, two inverters 12 and 14, three N-channel field-effect transistors (FET's) N1, N2 and N3, and two P-channel FET's P1 and P2. The interconnection of R and C at node 30 is connected to the inverting input of differential amplifier 16. The non-inverting input of differential amplifier 16 is connected through respective transistors P2 and N3 to terminals $V_H$ and $V_L$ respectively. The potentials at respective terminals $V_H$ and $V_L$ are provided by a suitable reference voltage source 22. The reference voltage source 22 provides the high voltage at terminal $V_H$ and the low voltage at terminal $V_L$, between which voltage levels capacitor C is charged and discharged.

The reference voltage source 22 comprises resistors 24, 26, and 28 connected in series between the power supply operating potentials $V_{DD}$ and $V_{SS}$. The output of the differential amplifier 16 is connected to one input of NAND gate 18. The output of NAND gate 18 is connected to output terminal 20. A feedback path from the output terminal 20 to the resistor-capacitor circuit at the inverting input of the differential amplifier 16 is provided by inverter 14, transistor P1, and transistor N1.

In operation, assume that the signal at the ENABLE terminal 32, connected to the input of inverter 12, is at $V_{SS}$ (logic 0). The output of inverter 12 is therefore at $V_{DD}$ (logic 1). This action conditions the oscillator not to oscillate by breaking the feedback path from the output terminal 20 to the resistor R. The ENABLE terminal 32 is also connected to the gate electrode of transistor N1. The output of inverter 12 is connected to the gate electrode of transistor P1. Therefore transistors P1 and N1 are conditioned for nonconduction. The output of inverter 12 is also connected to the gate electrode of transistor N2 conditioning that transistor for conduction. Transistor N2 is connected to conduct between the output terminal and the inverting input terminal of differential amplifier 16. The feedback connection provided by transistor N2 conditions differential amplifier 16 to operate as a non-inverting unity gain amplifier.

At the same time, a logic 0 input to NAND gate 18 from ENABLE terminal 32 conditions NAND gate 18 to provide a logic 1 output signal at terminal 20. A logic 1 condition at output terminal 20, which is connected to the gate electrodes of transistors P2 and N3, conditions transistor P2 for nonconduction and transistor N3 for conduction. The potential at terminal $V_L$ is therefore impressed at the non-inverting input terminal of differential amplifier 16. Since transistor N2, when conductive, conditions the differential amplifier 16 to be a non-inverting unity gain buffer, the output of differential amplifier 16 is forced to $V_L$ potential. Also, since transistor N2 is conductive, node 30 is also forced to $V_L$ potential. Therefore, when the oscillator is not conditioned to oscillate by virtue of a logical 0 signal at the ENABLE terminal 32, the capacitor potential $V_{RC}$ is maintained at $V_L$ potential.

The oscillator is started by applying a logic signal at the ENABLE terminal 32. The output of inverter 12 changes to logic 0 which conditions transistor N2 to be nonconductive. As a result, differential amplifier 16 is no longer operated as a unity gain amplifier, but is now operated as a comparator. The inverting input of differential amplifier 16 is connected to capacitor C which is initially at $V_L$ potential. The non-inverting input of differential amplifier 16 is also initially at $V_L$ potential because it is initially connected to terminal $V_L$ through transistor N3. Therefore, both comparator inputs are at the same potential. The indeterminacy is resolved as soon as an incremental amount of charge is removed from capacitor C through resistor R. Since only a very small decrease in capacitor C potential is necessary to resolve the indeterminacy, the output of differential amplifier 16 goes to logic 1 shortly after the logic 1 signal is applied to the ENABLE terminal 32.

Since both input terminals of NAND gate 18 are at logic 1, the output of NAND gate 18 at terminal 20 goes to logic 0. A logic 0 at terminal 20 conditions transistor P2 to be conductive and conditions transistor N3 to be nonconductive, thereby connecting terminal $V_H$ to the non-inverting input of differential amplifier 16. The logic 0 at terminal 20 also causes the output of inverter 14 to go to logic 1. The output of inverter 14 is connected to resistor R through transistors P1 and N1. Since the logic 1 signal at the ENABLE terminal 32 conditions transistor N1 to be conductive, and the logic 0 signal at the output of inverter 12 conditions transistor P2 to be conductive, the output of inverter 14 (at $V_{DD}$) is connected to resistor R through a low impedance path. Capacitor C begins charging towards $V_{DD}$.

When the capacitor potential at node 30 ($V_{RC}$) exceeds $V_H$, the output of differential amplifier 16 switches to a logic 0. A logic 0 at one input of NAND gate 18 causes the output to go to logic 1 at terminal 20 to condition transistor N3 for conduction and transistor P2 for nonconduction, thereby connecting terminal $V_L$ to the non-inverting input to differential amplifier 16. A logic 1 output at terminal 20 also switches the output of inverter 14 to logic 0 ($V_{SS}$). Since transistor P1 and N1 are still conductive, the logic 0 output of inverter 14 is connected to resistor R through a low impedance path. Thus, capacitor C begins discharging from $V_H$ towards $V_{SS}$ through resistor R. When the capacitor potential at node 30 ($V_{RC}$) is less than $V_L$, the output of differential amplifier 16 switches to a logic 1. The charging and discharging process then repeats itself to produce continuous oscillations at output terminal 20.

The oscillator is stopped by applying a logic 0 signal at the ENABLE terminal 32. Differential amplifier 16 again becomes a unity gain amplifier which maintains the capacitor potential at $V_L$. Since the initial potential across the capacitor is $V_L$, the first period of oscillation after the oscillator is started is substantially equal to the steady state period of oscillation.

Figure 2:
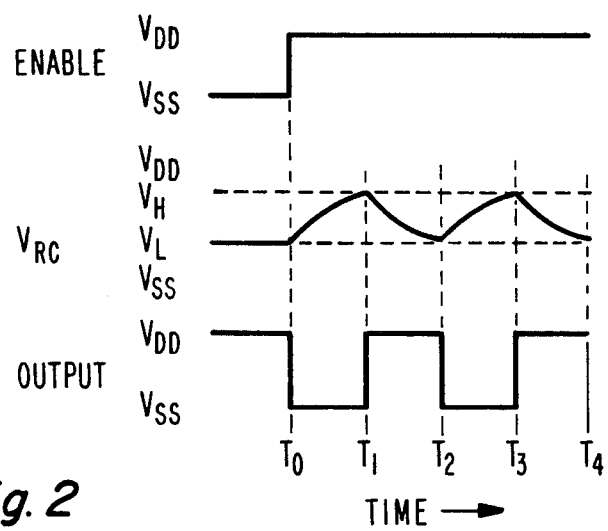
FIG. 2 is a time-voltage graph of the node voltages for the circuit of FIG. 1.

The circuit operation described above is illustrated graphically in FIG. 2. Prior to time $T_0$, the ENABLE signal is at $V_{SS}$ (FIG. 2a), the capacitor potential $V_{RC}$ is held at $V_L$ (FIG. 2b), and the output signal at terminal 20 is at $V_{DD}$ (FIG. 2c). At time $T_0$ the ENABLE signal goes to $V_{DD}$. In response, the output signal goes to $V_{SS}$. From time $T_0$ to time $T_1$, the capacitor potential $V_{RC}$ charges from $V_L$ towards $V_{DD}$. At time $T_1$, $V_{RC}$ reaches the potential $V_H$ causing the output potential to switch to $V_{DD}$. From time $T_1$ to $T_2$, the capacitor potential $V_{RC}$ discharges from $V_H$ towards $V_{SS}$. At time $T_2$, the capacitor potential $V_{RC}$ reaches the potential $V_L$, causing the output signal to switch to $V_{SS}$. From time $T_2$ to $T_4$ the process repeats itself producing a second period of oscillation.

The frequency of oscillation for the gated oscillator described above is determined by the value of resistor R, capacitor C, $V_H$ potential, and $V_L$ potential. The high and low reference potentials, $V_H$ and $V_L$ may be generated independently of the supply potentials $V_{DD}$ and $V_{SS}$. However, making $V_H$ and $V_L$ a function of the supply potentials reduces the effect of power supply variations on the frequency of oscillation.

In the embodiment disclosed, the capacitor potential is maintained at $V_L$ when the gated oscillator is stopped. Alternatively, the circuit of FIG. 1 may be readily adapted so as to maintain the potential on capacitor C at $V_H$ when the gated oscillator is stopped. In such case, the capacitor potential would be initially at $V_H$ and begin discharging towards $V_{SS}$ when the gated oscillator is started. In either case, the duration of the first period of oscillation is substantially equal to the duration of the steady state period of oscillation.

What is claimed is:

1. An oscillator comprising:
    a capacitor;
    charging means for alternately charging said capacitor substantially to a first voltage level and discharging said capacitor substantially to a second voltage level;
    gating means for selectively enabling said charging means to charge and discharge said capacitor responsive to a first level of binary control signal so as to condition said oscillator to oscillate, and for selectively disabling said charging means responsive to a second level of said binary control signal so as to condition said oscillator not to oscillate;
    a differential amplifier having first and second input terminals and an output terminal, said first input terminal of said differential amplifier being connected to said capacitor, said second terminal of said differential amplifier being coupled for receiving alternate ones of said first and second voltage levels and said output terminal of said differential amplifier being coupled to said charging means; and
    initialization means responsive to said second level of said binary control signal for maintaining the potential on said capacitor at one of said first and second voltage levels; wherein said initialization means includes switch means responsive to said second level of said binary control signal for selectively connecting said first input terminal to said output terminal of said differential amplifier.

2. An oscillator according to claim 1 wherein:
    said gating means includes feedback means connected to the output terminal of said differential amplifier for enabling said charging means in response to said first level of said binary control signal, and for disabling said charging means in response to said second level of said binary control signal.

3. An oscillator according to claim 2 further comprising:
    reference voltage means having first and second terminals for providing said respective first and second voltage levels; and
    switch means responsive to said output terminal of said differential amplifier for alternatively connecting said first terminal of said reference voltage means to said second terminal of said differential amplifier, and said second terminal of said reference voltage means to said second terminal of said differential amplifier.

4. An oscillator comprising:
a capacitor;
a differential amplifier having first and second input terminals, and an output terminal;
means for applying the potential on said capacitor to said first input of said differential amplifier;
reference voltage means having first and second terminals for providing respective first and second voltage levels;
switch means responsive to said output terminal of said differential amplifier for selectively applying alternate ones of said first and second voltage levels to said second input of said differential amplifier;
charging means responsive to said output terminal of said differential amplifier for alternatively charging and discharging said capacitor between said first and second voltage levels respectively;
gating means responsive to a first state of an enabling signal for conditioning said oscillator to oscillate, and responsive to a second state of said enabling signal for conditioning said oscillator not to oscillate; and
initializing means for maintaining said capacitor potential at one of said first and second voltage levels when said oscillator is conditioned not to oscillate wherein said initializing means includes
means for selectively applying one of said first and second voltage levels to said second input of said differential amplifier when said oscillator is conditioned not to oscillate; and
means for selectively connecting said output terminal of said differential amplifier to said first input terminal of said differential amplifier when said oscillator is conditioned not to oscillate.

* * * * *